United States Patent [19]

Shirley

[11] 4,394,693
[45] Jul. 19, 1983

[54] SYSTEM AND METHOD FOR GENERATING ENLARGED OR REDUCED IMAGES

[75] Inventor: Robert E. Shirley, Boulder, Colo.

[73] Assignee: International Business Machines Corporation, Armonk, N.Y.

[21] Appl. No.: 216,555

[22] Filed: Dec. 15, 1980

Related U.S. Application Data

[63] Continuation of Ser. No. 23,404, Mar. 23, 1979, abandoned.

[51] Int. Cl.³ .............................................. H04N 1/22
[52] U.S. Cl. ..................................... 358/298; 358/283
[58] Field of Search ............... 358/296, 298, 299, 302, 358/22, 77, 180, 283, 287

[56] References Cited

U.S. PATENT DOCUMENTS

| | | | |
|---|---|---|---|
| 3,976,982 | 8/1976 | Eiselen | 358/77 X |
| 4,075,663 | 2/1978 | Wellendorf | 358/287 X |
| 4,135,212 | 1/1979 | Pugsley et al. | 358/298 X |
| 4,163,249 | 7/1979 | Michael et al. | 358/180 X |
| 4,220,965 | 9/1980 | Heitmann et al. | 358/22 |

Primary Examiner—Bernard Konick
Assistant Examiner—Donald McElheny, Jr.
Attorney, Agent, or Firm—Fraser and Bogucki

[57] ABSTRACT

An image represented by an array of digitally valued picture elements is selectively reduced or expanded in size by the extraction or insertion of spaced apart rows and lines of picture elements, at positions which are the closest approximation to the newly scaled base, whether smaller or larger. In reproducing a given image, for example, the image may be concurrently or successively scanned by an array of photo detector elements and a plurality of digitally valued picture elements corresponding to grey scale values across the image, and distributed with a given resolution, may be generated. These values may be processed in real time, or stored in a comparable array for subsequent processing. In either event, the number of rows and lines in the array are modified in accordance with the desired scale factor, and these discrete changes are introduced at the closest approximation to optimum positions. In enlargement, the added lines are duplicative of the next adjacent line, whereas in reduction the lines are simply deleted and subsequent lines of picture elements are shifted to close the gaps and provide a continuous image. A dot generator array, such as an ink jet array, responsive to the digital values of the picture elements, operates in scanning fashion across a copy sheet and generates the image, at a modified scale factor in a single or in successive scans, which may occur at the same location or after transmission of the digitally valued picture data to a different location. However, other conventional image reproducing systems such as a cathode ray tube, electrostatic or thermal recording system may be utilized.

20 Claims, 5 Drawing Figures

SYSTEM AND METHOD FOR GENERATING ENLARGED OR REDUCED IMAGES

This is a continuation of application Ser. No. 23,404 filed Mar. 23, 1979, now abandoned.

BACKGROUND OF THE INVENTION

This invention relates to systems and methods for providing enlargement or reduction functions in a photocopy device of the type creating reproduced image by selectively defining rows and columns of picture elements.

The complex nature of contemporary society has created a need for an economical means to quickly reproduce printed materials. This need has been filled by numerous copy machines with the dry paper copier foremost in the field. With the advent of these machines, there has been a widespread growth in the manipulation, transmission and recordation of image data in a wide variety of forms. For a great many applications, the extremely high resolutions achievable with photographic films and other continuous tone media are not needed and copiers of low resolution utilizing digital imaging techniques or line scanning techniques have proved to generate acceptable copy quality at a lower unit cost. In these latter systems, a line resolution in the order of 0.1 mm is generally acceptable and capable of producing photographic grey scale, half tone and line images as well as alpha-numeric characters, graphical information and the like.

It is often desirable during copying to change the size of an image by enlargement or reduction within a range of an order of magnitude and sometimes more. The means currently known for effecting such changes are not amenable to a wide range of scale variations and seldom permit precise selection of scale factors without tedious and complex adjustments. The known systems also tend to be excessively cumbersome and costly. An image may be enlarged or reduced by an optical system but normally a system capable of reduction is not readily suitable for enlargement and vice versa. In addition, in either type of optical system, enlargements or reductions are usually available only in a limited range due to optical considerations and when a relatively broad scale factor change is required, the optical systems become inordinately complex.

An important desirable feature for such systems is that the image recording device should be a conventional and reliable system that need not be adjusted or manipulated to give different dot sizes for different image magnification or reduction ratios. While a reduction in dot size could give higher resolution on a reduced image, the complexity and greater degree of precision necessarily required with such a system would not be desirable for the great majority of applications. Known recording techniques for producing hard copy, such as dot matrix printers, are highly reliable and operate at high rates of speed, but essentially do not permit introduction of a change in dot size. This is true whether one considers an ink jet printer, electrostatic printer, impact printer or thermal printer. One of these devices can be chosen for a given image resolution in the final copy, but what is most important in many instances is to be able to immediately obtain a reproduced image of desired size that has reasonable fidelity to the original which itself need not be of high quality.

The patent to Suga U.S. Pat. No. 4,090,188 discloses a dot matrix converter. The patent directs itself to the solution of the problem of enlarging Chinese characters. Thus the printer is arranged to enlarge a Chinese character from a dot matrix of smaller size. To this end a new row and a new column are added to the original dot matrix. However opposed bits in the rows or columns are compared with each other. As a result the new character does not exactly resemble the smaller original character. Hence, a complicated comparison between adjacent dots of the original pattern must be effected.

SUMMARY OF THE INVENTION

In accordance with the invention a system and method are provided for transforming an image that is to be reproduced into a corresponding image by subdividing the original image into incremental picture element (pel) areas that are disposed in rows and columns. This pel data is analyzed relative to the scale factor or ratio selection of enlargement or reduction and the system then manipulates the pel data proportionally in the row and column directions in accordance with a predetermined format determined by the scale factor. For enlargement, the pel data is manipulated by adding pel rows and columns that are duplicative of preselected or predetermined ones of the adjacent pels, and, for reduction, by deleting preselected or predetermined ones of the pel rows and columns. Whether added or deleted, the modified pel row and column data are located at positions that most closely approximate the ideal increments for the chosen scale factor.

In a more specific example of a system in accordance to the invention, the original image is sequentially scanned by a plurality of detector elements, which together with associated circuits divide the image into an array of a given number of pel rows and columns. Signal amplitudes representing density or opacity variations at each pel are used in digital or grey scale fashion to ultimately energize corresponding ones of a plurality of recording elements, such as ink jet recorders. However, the signal amplitudes representing individual pel variations are processed and selectively modified in accordance with both column and row positions, such that additional rows and columns are added for purposes of magnification, while the numbers of rows and columns are likewise reduced for purposes of image reduction.

In the modification of the image in accordance with the scale factor selected, the processor analyzes the pel data of the original image relative to the number of rows or columns required for the modified image and selects that line placement which is the best approximation of the desired row or column position for each successive increment in the modified image. This selection is accomplished in part by mask creation circuitry which produces a mask utilized to control pel duplication or elimination for enlargement or reduction for image reproduction having the same number of pels per unit width length as per unit height. For example, in enlarging an image, an added row or column is inserted, in accordance with the mask, that is duplicative of either the last prior row or column or the next succeeding one, depending upon which existing row or column is the closest approximation to the desired position at a given point. The addition of either a row or a column is effected in the same format to provide an image which is proportional to the original in both the X and Y direction. In image reduction, the row or column that is deleted is the one falling between a pair of lines that are the closest approximation to the desired position. With this system, the reproduced image can be adjusted by a scale factor with a minimum of discontinuity and with fidelity generally equal to the original image in proportion and in information. Furthermore, the processing may be effected in real time either during successive individual scans of an image or by brief storage of the pel data of the original image.

The data output, after manipulation to compensate for scale factor, may now be used to control a scanning recorder or dot generator array. Such dot generators are well known in the art and may for example, be exemplified by an ink jet array, a cathode ray tube display, or an electrostatic or thermal picture reproducing system.

BRIEF DESCRIPTION OF THE DRAWINGS

A better understanding of the invention may be had by reference to the following description, taken in conjunction with the accompanying drawings, in which.

DETAILED DESCRIPTION

Figure 1:
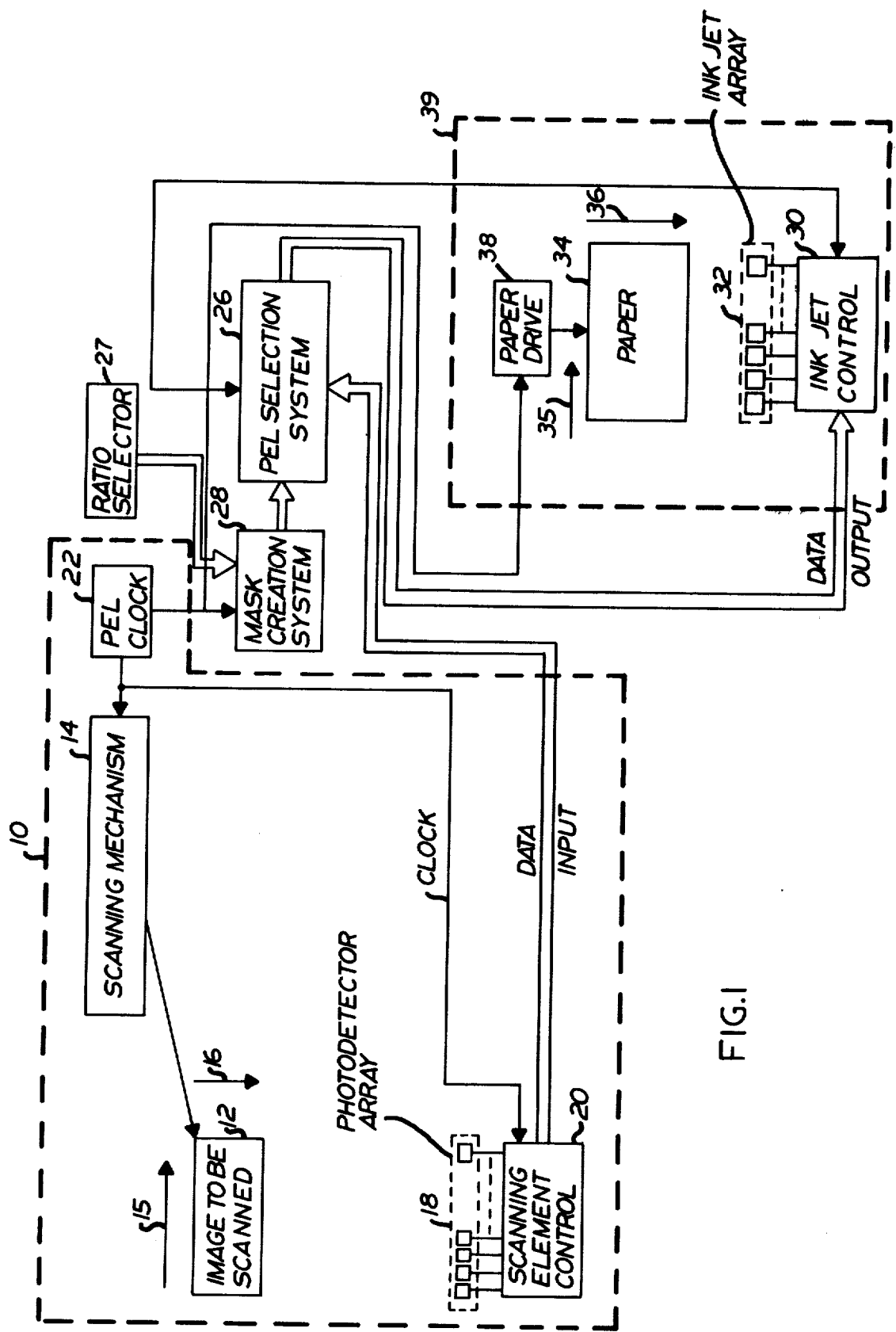
FIG. 1 is a block diagram of an overall system for reproducing an enlarged or reduced image of an original picture.

Referring now to the drawings and particularly to FIG. 1, there is illustrated in block diagram form, by way of example, a system in accordance with the invention for generating a dot data stream representing a picture, alpha-numeric data, or the like for subsequent enlargement or reduction. A document scanner 10 indicates schematically the principal elements used for scanning an original document or image for producing a signal sequence representative of row and column positions on the document. The individual components within the document scanner 10 may be conventional and details thereof may therefore be omitted for the sake of clarity. The document scanner 10 generates signal amplitudes representative of intensity variations of individual picture elements (pels) in a pel array of rows and columns of the image to be scanned on a document 12. A scanning mechanism 14, depicted only generally, provides relative movement between the document 12 and a detector system in a first direction as shown by arrow 15 and in a second orthogonal direction as illustrated by arrow 16. The detector system may include, for example, an array of photo detectors 18 (only a few of which are illustrated) which are disposed such that relative motion between the document 12 and the detectors 18 results in scanning of the entire picture over a period of time. Alternatively, a single scanner element can be employed if desired, with a consequent increase in scanning time. Obviously, the relative motion can be supplied by rotating a drum or reciprocating carriage on which a document is disposed, and a part or all of the motion can be supplied by the detector array. The derivation of pel signals from the photo detectors is controlled by a scanning element control 20 which is clocked by the pel clock 22 which also synchronously controls the scanning mechanism 14.

The data stream obtained from the scanning element control 20 corresponds to the intensity variations in the pels and may be provided serially for each row or column, depending on the scan direction). Each signal representative of an individual pel may have an amplitude corresponding to the grey value of the pel being scanned, or may simply be a binary signal established by a threshold detector (not shown). The signals from the scanning element control 20, identified as "data input" signals, are the input to a pel selection system 26, such as is more fully described hereinafter in connection with FIG. 4. Briefly, the pel selection system 26 may include means for storing a page or a portion of a page of the incoming data for further processing in accordance with a predetermined algorithm. The data output of the pel selection system 26 is effectively determined in part by a scale factor or image ratio selector 27 which is inputted into a mask creation system 28 coupled to the pel selection system 26 for making the determination.

By way of example, the output data from the pel selection system 26 (a number of parallel lines being energized concurrently) is coupled to an ink jet control 30 which selectively energizes elements of an array of conventional ink jet printer elements 32. The ink jet array 32 illustrated has only a relatively few elements, but it is to be understood that such an array typically includes an adequate number of ink jets for the size of documents to be reproduced. Reproduction in the instant example is effected on a paper 34 which is driven in orthogonal directions 35, 36 relative to the ink jets 32 by a suitable paper drive 38, which may be a drum or carriage device. Both the paper drive 38 and the ink jet control 30 are operated in synchronism by the pel clock 22 which clocks the entire system. Depending on the pel selection system 26 and the relationship of the scanning elements 18 and ink jets 32 the system may be operated in real time or with a delay between the input scan and output printing. For example, if the photosensitive elements and print elements can be sufficiently closely spaced for one to be used at each line, the system can operate in real time. In most instances the elements are more widely separated and an interlace technique must be employed. The image reproduction system 39 (depicted in dotted lines) is conventional, and other systems may be used in lieu thereof. However, such a high speed matrix printer has been disclosed, for example, in U.S. Pat. No. 3,833,891 to Roslyn et al. Such scanning recorder systems generate dot patterns in rows and columns on a medium such as paper 34 to depict the reproduced image.

Figure 2:
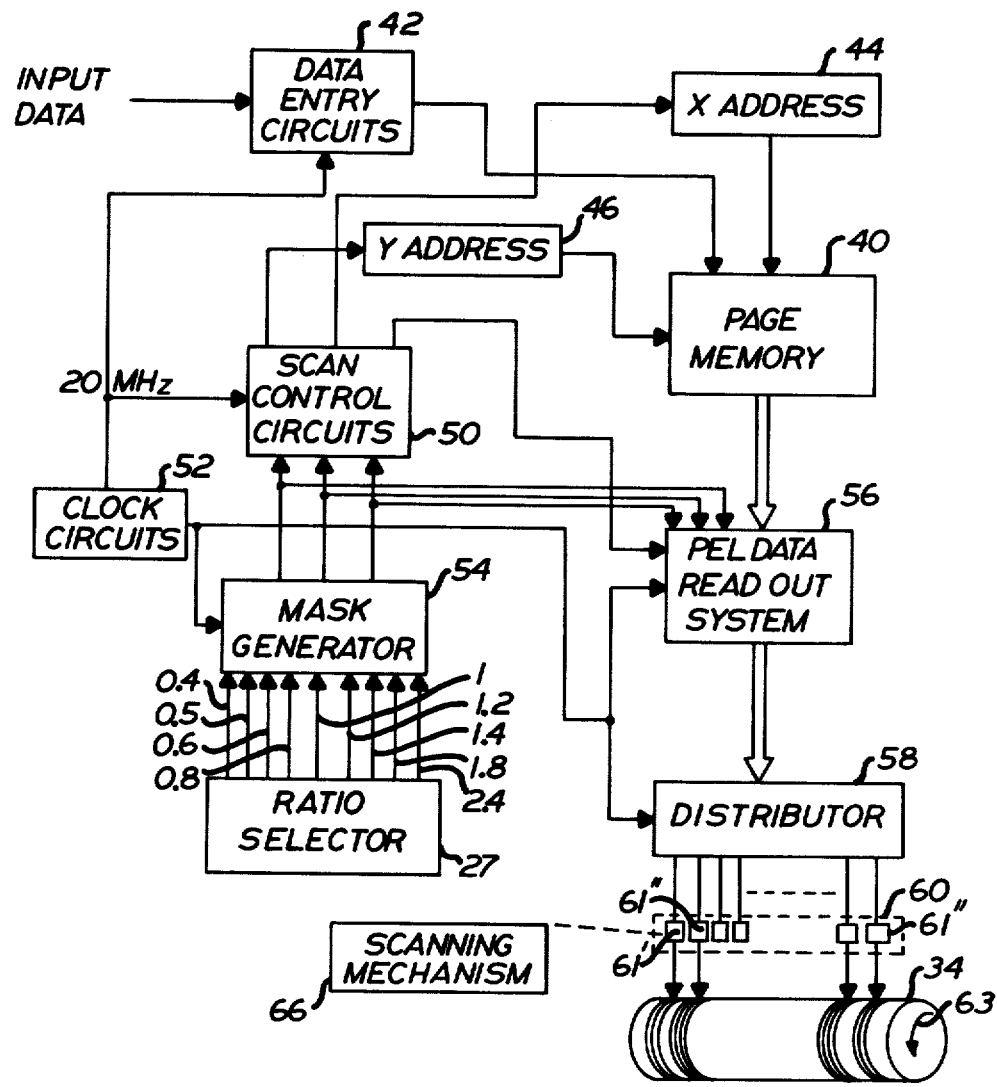
FIG. 2 is a functional block diagram illustrating enlarging/reducing scan converter circuitry in a digital dot matrix system.

Referring now to FIG. 2, there is shown a block diagram of an enlarging/reducing scan converter subsystem which may advantageously be employed to provide ratio selection, mask creation and pel selection. This system operates in a binary digital mode, although it may alternatively provide analog levels, if desired, by use of sufficient storage capability for grey scale values. The reproducing system includes a rotating drum 63 on which the paper 34 is fastened or positioned for reproducing the enlarged or reduced image. The subsystem of FIG. 2 converts image information into binary-valued picture element (pixel) form on a dot matrix basis. The resolutions of the original and reproduced images are the same (e.g. 100 pixels per inch in this example), but this is based on the premise that the master image and the printer are to have the same pixel size.

Obviously the sizes can be widely different, depending upon the nature of the reproduction to be made.

For this example, a page memory 40 is used to store a complete image of binary-valued pels, as derived from the document scanner 10 of FIG. 1. The page memory 40 may comprise any conventional digital storage means having the needed number of rows and columns, such as a semiconductor core, bubble or storage tube memory. A random access capability in both directions is not needed, inasmuch as shift registers can be used in one direction corresponding to the scan lines generated at the output printer. The scan rate of the page memory 40 system is to be adequately high to enable the printer elements to operate at optimum rate (e.g. 20 KHz) but with presently available digital memories, which have microsecond cycle times or less, this presents no practical problem.

The master image is stored, in effect, in the page memory 40 in straightforward fashion by entering the rows and columns of pels via data entry circuits 42 as X address circuits 44 and Y address circuits 46 increment the addresses in the usual fashion as determined by scan control circuits 50. Clock circuits 52 operating at a suitably high rate (e.g. 20 MHz) provide the basis for synchronization of data flow through the various circuits. While a full page memory provides a convenient example, it will be evident to those skilled in the art that, dependent upon the output printer, a lesser amount of storage may also be used. With a printing system that operates sequentially rather than in distributed fashion, only that portion of an image needed for real time operation need be stored. For example, if the output device records a single line at a time, then the storage can be similarly limited.

The data read out of the page memory 40 is fed into the pel data readout system 56, to be more fully described hereinafter in conjunction with FIG. 4. The scale factor or ratio selector 27 controls a mask generator 54 which in turn affects the scan control circuits 50 as well as the pel data readout system 56 for adding or deleting lines or columns in accordance with the reduction or enlargement ratio desired. In the example depicted, the ratio selector 27 provides four possible ratios other than unity for each function of enlargement or reduction, namely, for reduction, 0.4, 0.5, 0.6, and 0.8, and similarly for enlargement ratios 1.2, 1.4, 1.8 and 2.4. The ratios so selected are convenient examples that may be readily implemented, but as will hereinafter be discussed in detail, the ratio selection may be made on a continuously variable basis, or alternatively the ratio selector 27 may provide additional increments of ratios which may vary on a regular basis or in an arbitrary fashion, as desired.

The mask generator 54 is essentially a part of the mask creation system 28 depicted in FIG. 1, an example of which will be more fully described hereinafter in accordance with the discussion of FIG. 3. With only a limited number of ratio selections available, the mask generator 54 may include, for example, a read only memory (ROM) providing repetitive signal pattern sequences to the scan control circuits 50 and to the pel data readout system 56. A greater number of discrete ratios may likewise be made available simply by using a greater number of ROMs. Alternatively dedicated circuits or a microprocessor programmed to the general mask algorithm may be used to provide an arbitrary large number of ratios. However, for most applications, there is a practical limit on the enlargements and reductions that may be generated because of the image quality attainable with a given resolution.

The outputs from the pel data readout system 56 are provided to a controller or distributor 58 for controlling a printer 60 for reproducing the image by means of a number of ink jet devices $51'$, $61''$ ... $61^n$ equally spaced along a rotating drum 63 on which the image document or paper 34 is fastened or wrapped. A scanning mechanism 66 (e.g. carriage) provides movement of the printer jet devices $61'$, $61''$ ... $61^n$ along the length of the drum 63 for each successive rotation. The ink jet devides are spaced so as to span the entire document 34 at some time during recording, with each device successively covering a number of scan lines. Thus, ink jet devices spaced ten scan lines apart will record in the sequence 1, 11, 21, 31, etc. on the first rotation and then 2, 12, 22, 32, etc. on the next rotation. Where the image is to be greatly reduced from the maximum available size, obviously, only one or a few of the ink jet devices $61'$, $61''$ ... $61^n$ may be required to reproduce the image. Usually, the ink jet devices will be as closely spaced apart as permissible considering mechanical tolerances, and held at this fixed spacing. It will be evident that the printer elements may be mounted on a variable position mechanism such as a parallelogram or linkage-type device for displacement variation, which permits the spacing to be enlarged or reduced. This variation introduces an added factor in the mask generation function, and requires a precision mechanism for high resolution images in order to avoid gaps and overlaps in the reproduction.

The pel signals from the page memory 40 are suitably modified in the pel data readout system 56 to add or delete rows and columns in accordance with the ratio selected, with the output so modified being inputted to distributor circuits 58 which may comprise a shift register for receiving individual pel commands for each of the ink jet devices, which commands are then clocked out concurrently to insure uniform printing.

This system therefore operates by effecting changes in both columns and rows in order to enlarge or reduce the image that is being reproduced. With a square image, the number of columns and rows that are added or eliminated are the same. With a rectangular image the numbers are different, but the proportions automatically are held the same by mask generation. The mask that is followed may simple be repetitive in some instances, and in other instances the choice of positions at which pels are to be added or eliminated may require specific decisions. Namely, the basic algorithm to be discussed hereinafter with reference to FIG. 5 involves a determination of that position at which a given scan line or pel is closest to the ideal for a given image ratio. In scanning along a line, for example, a decision must be made as to the various points at which pels must be added during enlargement. If, in accordance with the algorithm for enlargement, the closest approximation falls between positions 75 and 76, then the pel for either position 75 or 76 is repeated dependent upon which is closer. There is a significant difference in the overall image by following this algorithm, instead of some purely repetitive scheme or an arbitrary rule as to approximation.

For a given ratio selection at the ratio selector 27, the mask generator 54 makes a determination for both rows (horizontal lines) and pel positions (vertical columns). No substantial demands are imposed on the mask generator 54 in doing this, because the row determination is made prior to the determination for individual columns. Using a number of ink jet heads 61', 61" ... 61ⁿ, however, the mask generator 54 is required to make determinations as to which ink jet heads are to be used, and what image line each head will reproduce. If only some of the ink jet heads 61 are to be used because of the small size of a reproduced image, then the remainder will be deactivated for that image. However, the mask generator causes each ink jet head 61 that is used during scanning for a given size image to be operated during each cycle of the drum 63, in order that there are no blank scan lines during operation. The mask generator 54 then controls the scan control circuits 50, and pel data readout system 56, so as to select the next succeeding line from the page memory 40 in the event that a horizontal row is to be omitted or cause repetition if a line is to be added. The scan control circuit 50 then controls the X and Y address circuits 44, 46 so that the rows needed to reconstitute the image are made available at the pel data readout system 56. The distributor 68 operates routinely in distributing the serial signal from the pel data readout system 56 to the appropriate ink jet heads 61', 61" ... 61ⁿ.

Thereafter, as the rows are scanned, the mask generator 54 determines which column positions are to be used. Because the ink jet heads are all in parallel relative to the vertical column positions, they all operate under mask control in the same fashion with respect to a given vertical column that is to be added or deleted.

Figure 3:
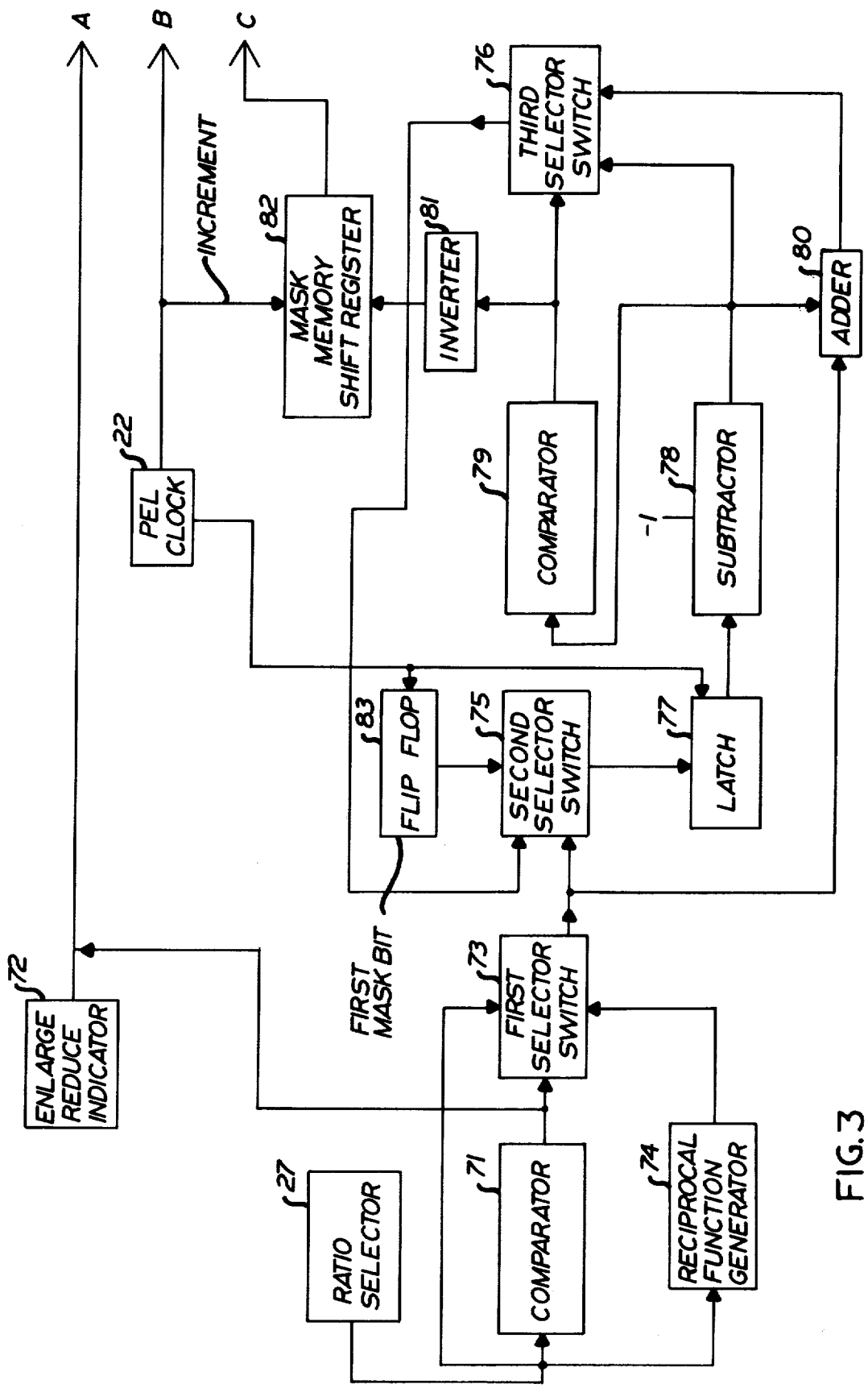
FIG. 3 is a functional block diagram illustrating mask creation circuitry useful in the system of FIG. 1.

FIG. 3 is a system block diagram of the mask creation circuitry 28 of FIG. 1. The mask produced by this circuit is utilized to control pel duplication or elimination for enlargement and reduction processes in an image reproduction system having the same number of pels per unit width as per unit height.

In FIG. 3, the scale factor or ratio selector 27 provides a means for an operator to select an enlargement or reduction ratio by setting a positive voltage representing the ratio of enlargement or reduction desired. This voltage may be selected by a continuously variable resistance means or any voltage control means providing predetermined value. The ratio selector 27 is adapted to select positive potentials greater than one for enlargement functions and positive potentials less than one for reductive operations. The voltage selected by the ratio selector 27 is applied to comparator 71 which produces a true output whenever the input is equal to or greater than the unit value 1. Any number of standard comparators may be utilized to provide this function, such as the LH2, LM, or LF versions of the series 111 integrated circuit voltage comparators.

The output of comparator 71 is applied to the pel selection circuitry at output "A" and to an enlarge/reduce indicator 72, which in a preferred embodiment may be comprised of a pair of mutually exclusively operable indicator lamps.

Comparator 71 also controls a first selector switch 73 which may be an electronic switch such as AH0014C, CF, D or CD. Selector switch 73 receives a first input in the form of an analog voltage from the scale factor selector 27 and a second input also in the form of an analog voltage from ratio selector means 27 via analog reciprocal function generator 74.

The first selector switch 73 is a double-pole single-throw switching means which will pass the analog voltage selected by ratio selector 27 as a positive potential >1. For instance, when a ratio or scale factor >1 is selected, comparator 71 produces a true output which causes selector switch 73 to pass the output of ratio selector 27 and block the output of reciprocal function generator 74. When a reduction scale factor is selected, the output of comparator 71 is false and the first selector switch 73 blocks the potential from the ratio selector 27 but passes the reciprocal output of the ratio selector 27 produced by reciprocal function generator 74.

The output of the first selector switch 73 is applied to one input of a second selector switch 75 which is a double-pole single-throw electronic switch which may be of the same type as utilized for the first selector switch 73 to minimize hardware requirements. This switch or selector is controlled by the output of flip-flop 83 so that the input from the first selector switch 73 is passed only at the beginning of the creation of a mask when the output of the flip-flop 83 is low. The output of flip-flop 83 goes high at the creation of the first mask bit and remains high, allowing selection of the second input (i.e., the output of the third selector switch 76) of selector 75, as the following bits are generated. Flip-flop 83 which may be a SN4109 is reset before mask generation begins by the first pel clock pulse. The output of selector 75 is applied to latch 77 which may be a sample and hold circuit such as the integrated circuit series LF198. The latch holds the potential passed by the second selector switch 75 for the duration of one pel. The latch is clocked by the pel clock 22, previously referred to and located in the scanning system 10 of the reproduction device. The analog potential presented by latch 77 is reduced by one unit value by subtractor 78 which may be a diode isolated summing junction having a negative one unit voltage input in addition to the input coupled to the latch 77.

The output of subtractor 78 is applied to comparator 79 which may be a circuit similar to comparator 71 except that it is adapted to provide a true output when the input is greater than one half a unit value. The output of comparator 79 controls the operation of the third selector switch 76 which is a double-throw single-pole electronic switch similar to selector switches 73 and 75. If functions to pass the output of subtractor 78 to the input of the second selector switch 75 when the output of subtractor 78 is greater than one-half a unit value (i.e. output of comparator 79 is true) and to pass the output of adder 80 to the input of the second selector switch 75 when the output of subtractor 78 is less than or equal to one-half a unit value. Adder 80 is a summing junction which combines the output of subtractor 78 and the output of the first selector switch 73 to create an analog potential which is applied to the input of the second selector switch 75 via selector the third selector switch 76 when the output of comparator 79 is false.

The output of comparator 79 is applied through inverter 81 to the mask memory shift register 82. Inverter 81 may be any inverter compatible with the circuitry utilized by the system and the mask memory shift register may be any compatible serial shift register such as the integrated circuit CD4031BM or BC series. Mask memory shift register 82 is incremented by the pel clock 22 to produce a logic output "C" to the pel selection circuitry which is a function of the selected scale factor. For instance, assuming a scale factor of 2 is selected, an analog voltage having a two unit value is produced by the ratio selector 27. Since this potential is greater than a single unit value, comparator 71 provides a true output which causes the first selector switch 73 to pass the positive two unit value to its output. The two unit value analog potential is applied through the second selector switch 75, since the output of flip-flop 83 is low at this time and causes latch 77 to reach a two unit value. This value is clocked by the pel clock through subtractor 78 and the resultant analog potential of one unit is applied to comparator 79. This causes a true output of the comparator 79 and the true output causes the third selector switch 76 to couple the one unit analog potential output of subtractor 78 to the alternate input of the second selector switch 75. This causes selector 75 to inhibit passage of the input from selector 73 and pass the input from selector 76 to latch 77. The output of selector 76 is one unit value and thus the input to subtractor 78 at the next pel clock will be one unit value. This causes a zero output and the output of comparator 79 is false. Selector 76 then switches and inhibits passage of the output of subtractor 78 and couples the output of adder 80 to selector 75. At this time the output of adder unit 80 is the two unit potential constantly being passed by selector 73 and the zero potential output of subtractor 78. The resultant two unit value is passed through the bird selector switch 73 and the cycle is repeated. As this cycle is repeated, the output of comparator 79 goes from "1" to "0" or true to false and this through the inverter 81 creates an electronic mask comprised of a 0101 repetitive input to shift register 82 which produces an electronic mask comprised of a repetitive 1010 pulse train.

In accordance with the electronic mask, with a scale factor of 2, that is greater than unity, the enlarge/reduce indicator 72, so indicates and the algorithm views the pulse train as a series of commands for each pel of the original image with a "1" in the pulse train effectively instructing the printer to reproduce a pel from the original image with the "0" in the pulse train instructing the printer to duplicate the last pel.

By way of another example which will be amplified hereinafter with reference to FIG. 5, if the scale factor selector is 5/3, the repetitive pulse train will be 110101101011010, etc. Correspondingly, for this enlargement scale factor, the print instructions in both the column and row direction will be identical with each "1" effectively instructing the printer to print that corresponding pel of the original image, and each "0" effectively instructing the printer to duplicate the immediately preceding pel row or column.

Conversely, if reduction is indicated at indicator 72, the repetitive pulse train for the inverse scale factor of 5/3 will be identical. That is, for a scale factor of 3/5, the repetitive pulse train will be 110101101011101, etc., with each "1" in the train effectively instructing the system to print in the reduced image the pel corresponding to the original image with each "0" instructing the system to eliminate that pel row or column of the original image at that location with the gap on the reproduced reduced image being closed by means of the pel data readout system 56.

Similarly, if a scale factor of ½ were selected, the system would function in an identical manner to that described with reference to a scale factor of 2, except that the positive 2 unit value potential present at the output of selector 73 would be derived via reciprocal function generator 74 rather than directly from the ratio selector 27. If a scale factor of 3 were selected, the sequential output of comparator 79 would be 110110110, etc. and this would be repeated for the duration of the electronic mask as a repetitive 001 code.

Figures 4, 5:
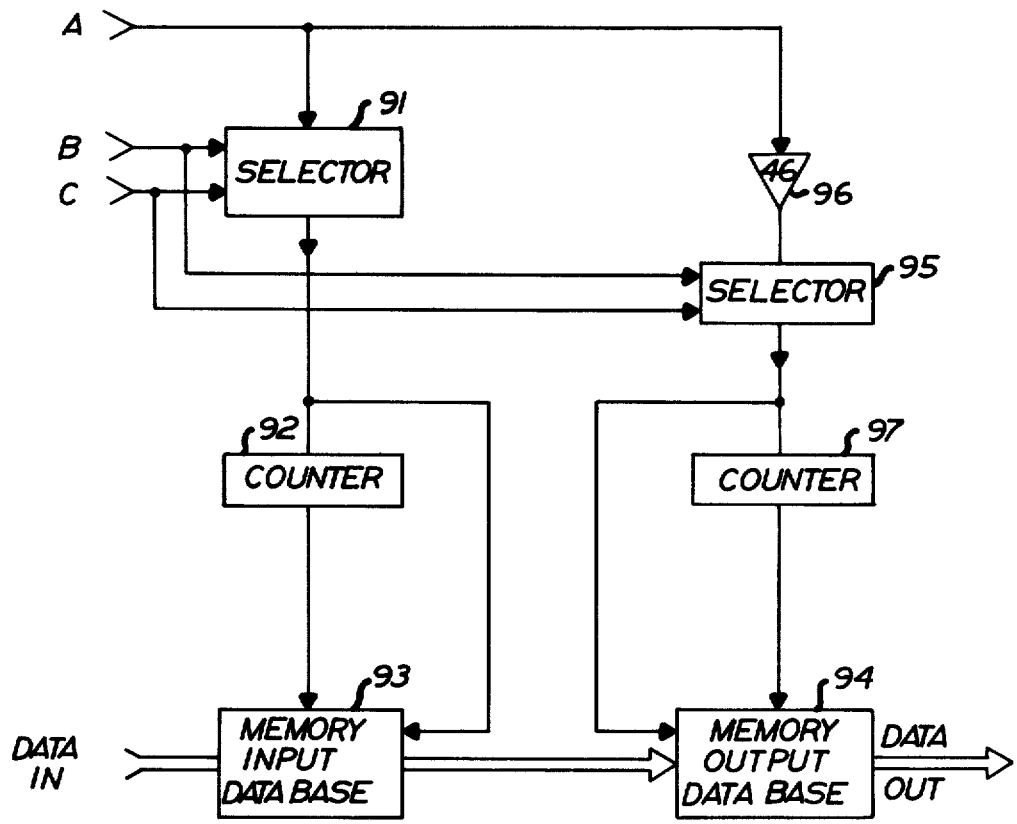
FIG. 4 is a functional block diagram illustrating pel selection circuitry useful in the system of FIG. 1.
FIG. 5 is a diagrammatic illustration of a pel data selection sequence in accordance with the invention.

The electronic mask output C of the mask memory serial shift register 82 of FIG. 3 is applied to one input of selector 91 of the pel data readout system 56, more fully shown in FIG. 4. This selector forms part of the pel selection system 26 of FIG. 1. It is a double-pole single-throw switch which in a preferred embodiment is an electronic switch similar to selector switches 73 and 76 of FIG. 3. Selector 91 is responsive to a control function input A from comparator 71 of FIG. 2. This control input from the comparator is true if an enlarge function has been selected wherein the output is equal to or greater than 1 and false when the output of the comparator is zero. If an enlarge function was selected, the input from the mask memory serial shift register 82 of FIG. 2 will be coupled to counter 92.

Counter 92 is an increment counter such as the integrated circuit type DM75/8570 or SM76/86L70. In a preferred example the counter is an 8 bit shift register which features a gated serial input and an asynchronous clear. The output of counter 92 addresses memory input data base 93 which receives data in its entirety from the page memory 40. The memory 93 may be any one of a large variety of memory register devices but in a preferred embodiment is an integrated circuit such as MM74C200 which is a 256 bit tri-state random access read/write memory having an input capable of accepting 8 address lines and a write enable line. Counter 92 addresses a single memory site for each "1" pulse of the electronic mask.

In enlargement mode, selector 91 selects the mask, C, and selector 95 selects the pel clock, B. The mask pulse train and pel clock are synchronized. Since the output of selector 91 is connected to counter 92 and memory 93, each time a "1" appears on the mask, the address of memory 93 is incremented and the contents of this next successive address are read out and transferred to the input of memory 94 where it is held until the next "1" in the mask. Since the output of selector 95 is connected to counter 97 and memory 94, the address of memory 94 is incremented and another pel is read into memory 94 on every period of the pel clock. For enlargement, these pels are new pels when the mask is a "1" but are duplicates of the last pel when the mask is a "0".

In reduction mode, selector 91 selects the pel clock, B, and selector 95 selects the mask, C. So, a pel is read out of memory 93 on every period of the pel clock but is only read into memory 94 when the mask is a "1". When the mask is a "0" memory 94 is idle and therefore this pel is discarded from the output data base.

The output of memory output data base 94 is the image signal which is applied to each picture element in the dot matrix during image generation. That is, if an enlargement function similar to that previously described having an electronic mask function code of 101010 or an enlargement function of 2 were selected, the output of memory output data base 94 would be two identical pel outputs for each alternate pel input to memory input data base 98. The output of memory 94 would also cause the scan or row functions to be duplicated so that in addition to each column of pels being reproduced a second time to duplicate the input, each row or scan would be duplicated so that the final image generation would be twice the size of the original.

In the event that a reduction function were selected, memory output data base 94 would function in a manner identical to that required for enlargement functions except its output would be reducing the row and column pel structure by a factor equal to the code generated by the mask memory serial shift register 82.

In order to visualize the mask algorithm, by reference to FIG. 5, there is diagrammatically depicted in horizontal rows the "mask" repetitive pulse train, with the next horizontal row comprising a series of vertical lines, equally spaced to indicate the center to center pel spacing of the original image, with the next horizontal row of vertical lines being likewise equally spaced to depict the center to center pel spacing of reduced data when a scale factor of 3/5 is selected, that is, a reduction ratio. By visualizing the reduced data base as a pel selection from the original data base on the premise that the center to center pel spacing of the reduced data base is constant and of a greater center to center distance than the original base, the algorithm selects the pel from the original image nearest the pel for the reduced image with the remainder of the original pels being discarded, and consequently not printed for the reduced image. The vertical lines depicting the pel spacing of the original are designated a, b, c, d, and e, which then repeats itself in accordance with the mask 01101. With a scale factor of 3/5, only three of the original pels are reproduced, and the three pels so reproduced being depicted in the bottom row with the designations b', c' and e', effectively correlating to the reproduction of original pels b, c, and e which, as can be seen, are in vertical alignment with the "1" of the mask with the original pels in vertical alignment with the "0" of the mask being discarded for reduction purposes. It is to be understood, that the depiction in FIG. 5 is diagrammatic for the purpose of defining and explaining the creation of the algorithm to be followed by a system in accordance with the invention, with the ultimate printing of the pels correlated to b', c' and e' being spaced relative to each other with the same resolution as the original image resulting in both the row and column size of the reduced image being 3/5ths that of the original image. In the illustration of FIG. 5, the first vertical line depicting b' in the lower horizontal row is nearer the "b" pel line of the original than to the "a" pel line resulting in the "a" pel line of the original being discarded and the "b" pel line of the original being reproduced. Similarly, the second vertical line of reduced data designated c' is closer in spacing to the "c" pel line of the original data than to the "d" pel line of the original resulting in the "c" pel being reproduced as c' with the "d" pel line of the original being discarded. In enlargement, the algorithm treatment is simply a corollary to reduction.

The mask created in accordance with the invention has the property of being able to create any scale factor while creating the smoothest possible scaling by duplicating and/or discarding the smallest number of contiguous pels necessary for creation of the so-called data base.

The algorithm so derived produces a predetermined format for pel selection of the data of the page memory 40 via the pel data readout system 56 for selectively printing predetermined ones of the original pel data rows and columns with the selection of predetermined ones of the original image pels for duplication or deletion, with the predetermined format being applied in both the row and column direction to maintain proportionality in the scaled image utilizing the same dot sizes for providing the closest approximation to the ideal.

While there has been shown and described a preferred embodiment, it is to be understood that various other adaptations and modifications may be made within the spirit and scope of the invention.

What is claimed is:

1. A system for reproducing an original image of given size in a selectable reproduced size that is variable within a substantial range, comprising:
    scanning means for generating a pel array pulse train representative of intensity variations of individual pels in a pel array of rows and columns on the original image;
    scanning recorder means for generating dot patterns in rows and columns on a reproduced image medium; and processor means responsive to the pel array pulse train generated by the scanning means for altering the pel array pulse train to modify the number of rows and columns in the pel array of rows and columns on the original image, the processor means including means for selecting one of a plurality of different scale factors, means responsive to a selected scale factor for generating a coded pulse train having pulse positions synchronized with the pel array pulse train, the coded pulse train being comprised of pulses of first and second values, the arrangement of which is determined by the selected scale factor and varies for different scale factors, means for sequentially storing the individual pulses of the coded pulse train, means for sequentially applying the stored individual pulses of the coded pulse train to alter the pel array pulse train, and means for providing the altered pel array pulse train to the scanning recorder means to modulate the dot patterns generated thereby.

2. The invention as set forth in claim 1 above, wherein said processor means includes means for selecting rows and columns of the pel array for modification that are closest to the individual fractional positions that are needed at each increment for the selected scale factor, and wherein said processor means (1) repeats rows and columns of the pel array at the selected positions for image enlargement or (2) deletes rows and columns of the pel array at the selected positions.

3. The invention as set forth in claim 2 above, wherein said scanning means has a plurality of scanning elements, and wherein said scanning recorder means has a plurality of elements, each providing a dot area representing the pel area on the original image.

4. The invention as set forth in claim 1 above, wherein said processor means identifies selected rows and columns of the pel array of rows and columns on the original image to be repeated for enlargement or deleted for reduction in accordance with their proximity to optimum positions for the selected scale factor.

5. A system for reproducing a graphic image in a different size, comprising:
    means responsive to intensity variations of individual pel areas of an original image for providing signal variations representative thereof;
    processor means responsive to the signal variations for processing the signal variations to modify the number of pel areas of the original image in two orthogonal directions, said processor means including means for selecting any value within a given range of factors by which the size of the original image is to be modified and a mask generator for selecting rows and columns of pel areas of the original image where modifications are to occur, the mask generator being responsive to a selected value within the given range of factors to select different rows and columns of pel areas of the original image where modifications are to occur in accordance with a predetermined algorithm; and means responsive to the processed signal variations for producing an image therefrom.

6. The invention as set forth in claim 5 above, wherein said system represents the original image in terms of pel area rows and columns, and (1) enlarges the original image by adding rows and columns corresponding to the closest approximate row or column respectively for a given scale factor and (2) reduces the original image by deleting rows and columns corresponding to the closest row or column respectively for the approximation to the desired scale factor.

7. The method of reproducing an image of one size into an image of a different size comprising the steps of:
dividing an original image into a pel array of rows and columns of pel areas, each pel area corresponding to a dot area to be reproduced;
selecting any desired value within a range of different factors by which the size of the original image is to be modified;
generating a pulse train comprised of an arrangement of individual pulses of first and second values determined by the selected desired value within the range of different factors in accordance with an algorithm;
sequentially applying the individual pulses of the pulse train to modify the pel array of the original image in response to each pulse of the first value; and
reproducing the original image in accordance with the modified pel array of the original image.

8. The invention as set forth in claim 7 above, wherein the pel array of the original image is modified by adding a number of rows and columns of pel areas in response to the pulses of first value, the added rows and columns of pel areas being spaced in closest approximation to the successive incremental positions for a scale factor represented by the selected desired value within the range of different factors.

9. The invention as set forth in claim 7 above, wherein the original image is to be reproduced in reduced size, and wherein the number of rows and columns of pel areas is modified by deleting rows and columns of pel areas in response to the pulses of first value, and wherein the deleted rows and columns of pel areas represent the closest approximation to the successive incremental positions for a scale factor represented by the selected desired value within the range of different factors.

10. An image size controlling means for an image generator of the type which produces an image comprised of a plurality of individual picture elements, comprising:
means for providing a value from a range of possible sizes of an image to be generated;
means for generating a coded pulse train comprised of pulses of first and second values, the pulse train being variable as determined by an algorithm in accordance with the provided value;
means providing a sequence of successive signals representing individual picture elements in an image; and
means responsive to pulses of a selected value in the coded pulse train for modifying the successive signal sequence to enlarge or reduce the sequence in accordance with the coded pulse train.

11. The invention as set forth in claim 10 above, wherein said means for modifying deletes signals representing picture elements.

12. The invention as set forth in claim 10 above, wherein the means for modifying selectively duplicates signals representing picture elements.

13. An apparatus for controlling the scale factor in an image generator of the type creating an image comprised of a plurality of individual picture elements generated in a row and column format and processed in the form of a picture element pulse train, comprising:
means for providing a picture element pulse train representing an image;
means for selecting one of a plurality of different scale factors;
means responsive to a selected scale factor for generating an electronic mask comprised of a coded pulse train having pulses of first and second values, the arrangement of the pulses of first and second values in the coded pulse train being determined by the selected scale factor and varying for different scale factors, the means for generating an electronic mask comprising a pulse generating means responsive to said means for selecting for generating the coded pulse train and means for sequentially storing the coded pulse train from said pulse generating means; and
means for applying the coded pulse train to alter said picture element pulse train.

14. An apparatus as defined in claim 13 wherein said means for applying the coded pulse train to alter said picture element pulse train comprises memory means for storing said picture element pulse train in discrete, addressable memory locations in accordance with the first and second values in the coded pulse train.

15. An apparatus as defined in claim 14, comprising:
means for generating a picture element clocking signal; and
addressing means responsive to the coded pulse train, the picture element clocking signal, and the picture element pulse train for entering the altered picture element pulse train in successive addresses of said memory means.

16. An apparatus as defined in claim 15 wherein the system operates to perform an enlarge function and different portions of the picture element pulse train are selectively repeated in successive positions in the memory means in response to the coded pulse train.

17. An apparatus as defined in claim 15 wherein the system operates to perform a reduction function and different portions of the picture element pulse train are selectively deleted during entry thereof into the memory means in response to the coded pulse train.

18. An apparatus as defined in claim 13 wherein the means for sequentially storing the pulses comprises a shift register coupled to receive pulses from said pulse generating means.

19. An apparatus as defined in claim 18 wherein said means for selecting one of a plurality of different scale factors comprises:
means for selecting a voltage level;
comparator means for comparing said selected voltage level with a reference voltage level;
means for providing the reciprocal of said selected voltage level; and
switch means responsive to said comparator means for mutually exclusively coupling said selected voltage level or the reciprocal of said selected voltage level to said pulse generating means.

20. An apparatus as defined in claim 18 wherein said pulse generating means comprises:

first switch means;

sample and hold means to store the voltage level at the output of said first switch means;

subtractor means for subtracting a reference voltage from the voltage level in said sample and hold means;

unity determining means for determining when the output of said subtractor is greater than one half of said reference voltage;

summing means for adding the output of said scale factor selector and said selector;

second switch means responsive to said unity determining means for mutually exclusively coupling the output of said subtractor or said summing means to said first switch means, said first switch means being responsive to the output of said second switch means for mutually exclusively coupling the output of said second switch means or said scale factor selector to said sample and hold means; and means to couple the output of said unity determining means to said shift register.

* * * * *